United States Patent [19]
Kato et al.

[11] Patent Number: 4,970,572
[45] Date of Patent: Nov. 13, 1990

[54] SEMICONDUCTOR INTEGRATED CIRCUIT DEVICE OF MULTILAYER INTERCONNECTION STRUCTURE

[75] Inventors: Toshiya Kato, Kawasaki; Motohiro Enkaku, Sagamihara, both of Japan

[73] Assignee: Kabushiki Kaisha Toshiba, Kawasaki, Japan

[21] Appl. No.: 318,791

[22] Filed: Mar. 3, 1989

[30] Foreign Application Priority Data

Mar. 4, 1988 [JP] Japan .................................. 63-50906

[51] Int. Cl.⁵ .................... H01L 23/48; H01L 29/46; H01L 29/54; H01L 29/62
[52] U.S. Cl. ...................................... 357/71; 357/68; 357/65; 357/54
[58] Field of Search .................... 357/71, 71 R, 71 P, 357/54; 361/392

[56] References Cited

U.S. PATENT DOCUMENTS

4,021,838  5/1977  Warwick ........................... 357/71 X
4,594,606  6/1986  Goto et al. ........................ 357/71 X

FOREIGN PATENT DOCUMENTS

0114358  2/1980  Japan ................................. 357/71

Primary Examiner—Rolf Hille
Assistant Examiner—D. M. Ostrowski
Attorney, Agent, or Firm—Finnegan, Henderson, Farabow, Garrett, and Dunner

[57] ABSTRACT

A semiconductor integrated circuit device of multilayer interconnection structure includes a pad formed of a multilayer interconnection layer. The power source pad is connected to a power source interconnection layer via a lead-out interconnection layer which is formed of the same multilayer interconnection layer as that used to form the power source pad.

2 Claims, 5 Drawing Sheets

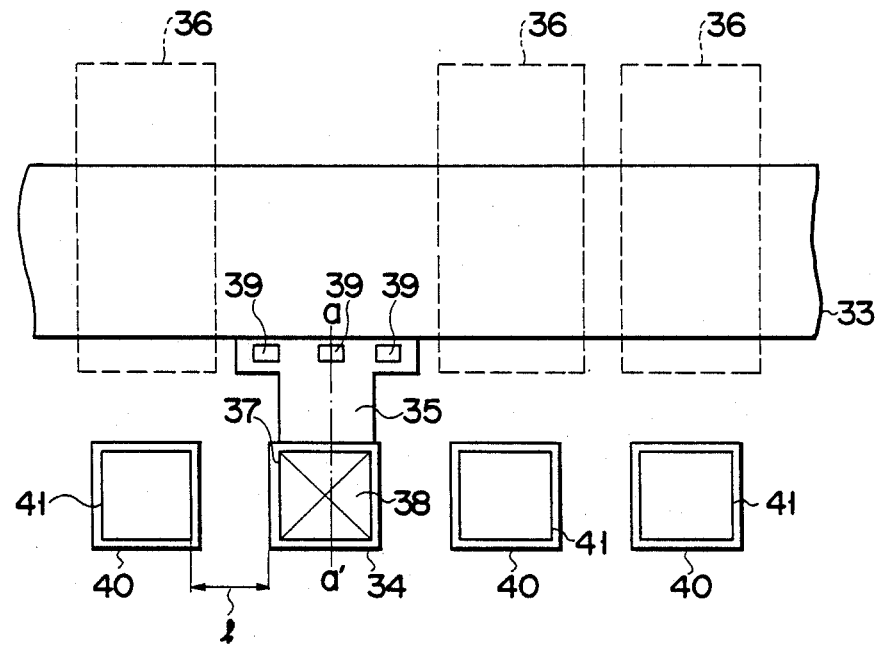
F I G. 4
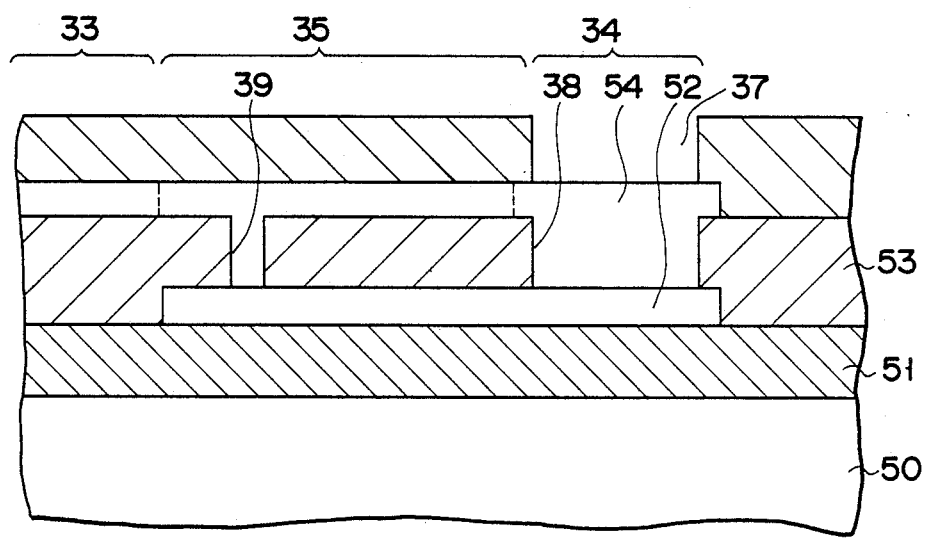
F I G. 5

SEMICONDUCTOR INTEGRATED CIRCUIT DEVICE OF MULTILAYER INTERCONNECTION STRUCTURE

BACKGROUND OF THE INVENTION

1. Field of the Invention

This invention relates to a semiconductor integrated circuit device of multilayer interconnection structure.

2. Description of the Related Art

In recent large scale semiconductor integrated circuit devices (LSI), the integration density of elements has become extremely high, and the current consumption has increased accordingly. In order to supply a power source voltage to an LSI requiring such a large current capacity, one conventional method used to attain the current capacity required is to employ a plurality of power source pads. However, using this conventional method, it is necessary to provide a large number of external terminals (pins) on the LSI. Moreover, the above method is not suitable for use with an LSI through which a large number of input and output signals pass. In addition, the greater the number of pins required, the greater the size of the chip will be.

Therefore, in the prior art, another method of increasing the current capacity has been developed, in which a plurality of lead-out wirings extend from the power source pad or the wiring width of the lead-out wiring is increased. FIG. 1 is a plan view of a conventional LSI chip the current capacity of which is increased by use of the above described methods. In FIG. 1, 10 denotes the main body of the chip, and 11, an internal circuit area is provided therein. Power source interconnection layers 12 and 13 formed of metal are arranged in annular form around internal circuit area 11 or on the peripheral portion of the chip, and supply high potential power source voltage Vcc and low potential power source voltage Vss to circuit area 11. In FIG. 1, 14 denotes a power source pad to which power source voltage Vcc to be supplied to power source interconnection layer 12 is supplied from outside the chip, power source pad 14 being connected to an external pin of the LSI, via a bonding wire (not shown), as well as to power source interconnection layer 12, via lead-out interconnection layer 15. 16 and 17 denote power source pads to which power source voltage Vss to be supplied to power source interconnection layer 13 is supplied from outside the chip, pads 16 and 17 being connected to external pins, via bonding wires (not shown). Power source pad 16 is additionally connected to power source interconnection layer 13, via lead-out interconnection layer 18, power source pad 17 being also connected to power source interconnection layer 13, via three lead-out interconnection layers 19, 20 and 21. Althrough not shown, various pads for other power source supply and for signal input and output are arranged on the peripheral portion of main chip body 10. The entire chip is basically covered with a protection film (not shown), and openings are formed in those portions of the protection film at which each of the pads for connection with the bonding wires are provided.

In the case where the current capacity is increased by increasing the widths of lead-out interconnection layers 15 and 18 extending from pads such as power source pads 14 and 16, the condition of bonding the bonding wire to the pad must be taken into consideration as the limiting factor, and therefore the width of the interconnection layer 18 cannot be made too large. The limiting factor is that the pad shape must be correctly recognized in the bonding process. That is, it is definitely necessary that the pad area must be clearly recognized. Therefore, it is basically necessary to set the width of the lead-out interconnection layer to be smaller than that of the pad. If it is required to set the width of the lead-out interconnection layer to be equal to or larger than that of the pad, it is necessary to form pad recognition slits 22 in lead-out interconnection layers 15 and 18 as shown in FIG. 1. Thus, even if the width of the lead-out interconnection layer is increased, the pad shape can be correctly recognized at the time of bonding by forming the slits. However, formation of the slits will increase the chip size. This is because the limiting factor is also involved in the case of the bonding with respect to the pad.

FIG. 2 is a pattern plan view showing an enlarged portion of the chip shown in FIG. 1. In FIG. 2, 23 denotes input/output cells formed on the peripheral portion of main chip body 10, 13 denotes a power source interconnection layer for supplying power source voltage Vss to input/output cells 23, and 24 denotes an opening of power source pad 16, in which no protection film is formed and a bonding wire is connected to the pad. The limiting factor involved in this chip is that distance 1 between the end of lead-out interconnection layer 18 connected to pad 16 and opening 26 formed in an insulation film in another pad 25 must be set to be larger than a predetermined value. Distance 1 is necessary to protect elements from being destroyed by mechanical shock at the time of bonding, short-circuiting caused by bonding effected with low precision, or the like. Thus, it is necessary to set the distance pads to be larger than a predetermined value. In that way, when the width of the lead-out interconnection layer is increased, the chip size will be increased.

In a case where, the pad as shown in, for example, in FIG. 1, is connected to the power source interconnection layer via a plurality of lead-out interconnection layers, and can serve a current capacity of a plurality of pads by itself, there is required an increase in area and hence an increase in chip size. Thus, in order to increase the power source current capacity according to the conventional method, the chip size must be increased.

SUMMARY OF THE INVENTION

The present invention has been developed in light of the above situation, and has as an object to provide a semiconductor integrated circuit device of multilayer interconnection structure, wherein the power source current capacity can be increased without leading to an increase in the size of the chip.

According to this invention, there is provided a semiconductor integrated circuit device of multilayer interconnection structure, comprising a semiconductor chip; at least one power source interconnection layer arranged on the peripheral portion of the semiconductor chip area; at least one power source pad arranged near the power source interconnection layer on the semiconductor chip area; and at least one lead-out interconnection layer for connecting the power source interconnection layer to the power source pad, the power source pad being formed of a multi-layered conductive layer and the lead-out interconnection layer being formed of a multi-layered conductive layer.

Further, according to this invention, there is provided a semiconductor integrated circuit device of multilayer interconnection structure, comprising a semiconductor substrate; a first conductive layer formed on a first insulation film which is formed on the semiconductor substrate; a second insulation film, formed on the first conductive layer; first and second openings formed in the second insulation film; and a second conductive layer formed to fill the first and second openings; part of the second conductive layer being used to constitute a power source interconnection layer, part of the first conductive layer which lies near the first opening and part of the second conductive layer which lies in and near the first opening being used to constitute a power source pad, and parts of the first and second conductive layers which are formed to extend from the first opening to the second opening being used to constitute a lead-out interconnection layer for connecting the power source pad to the power source interconnection layer.

BRIEF DESCRIPTION OF THE DRAWINGS

FIG. 4 is a pattern plan view showing part of the device of the embodiment shown in FIG. 3;

FIG. 5 is a sectional view taken along line a—a' of FIG. 4;

DETAILED DESCRIPTION OF THE PREFERRED EMBODIMENTS

Figure 1:
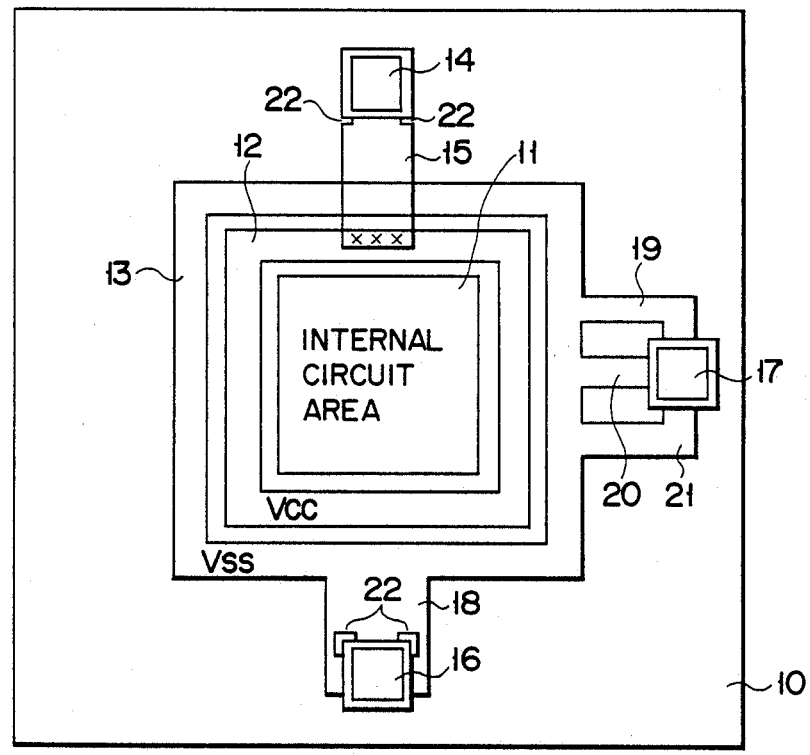
FIG. 1 is a plan view of the conventional LSI chip.
Figure 2:
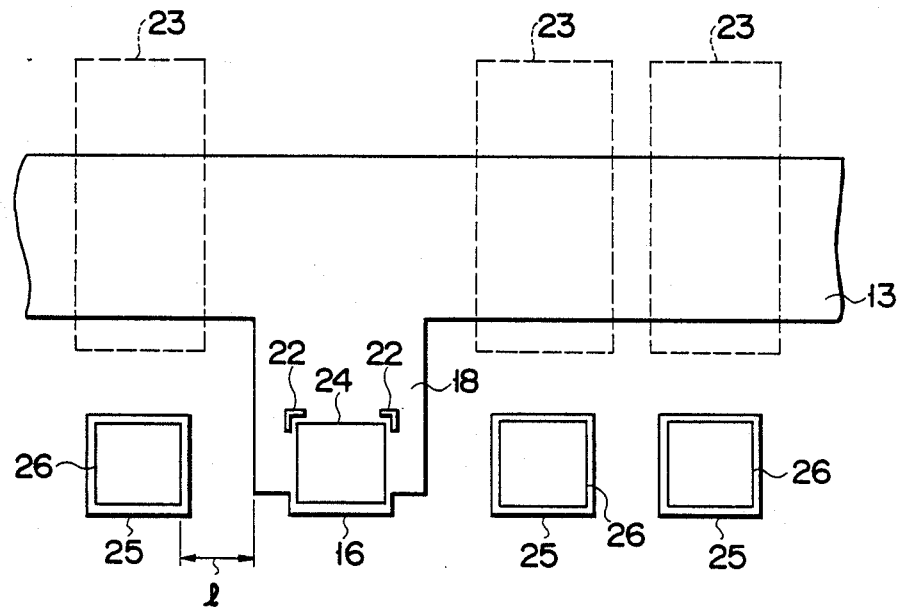
FIG. 2 is a pattern plan view showing an enlarged portion of the chip of FIG. 1.
Figure 3:
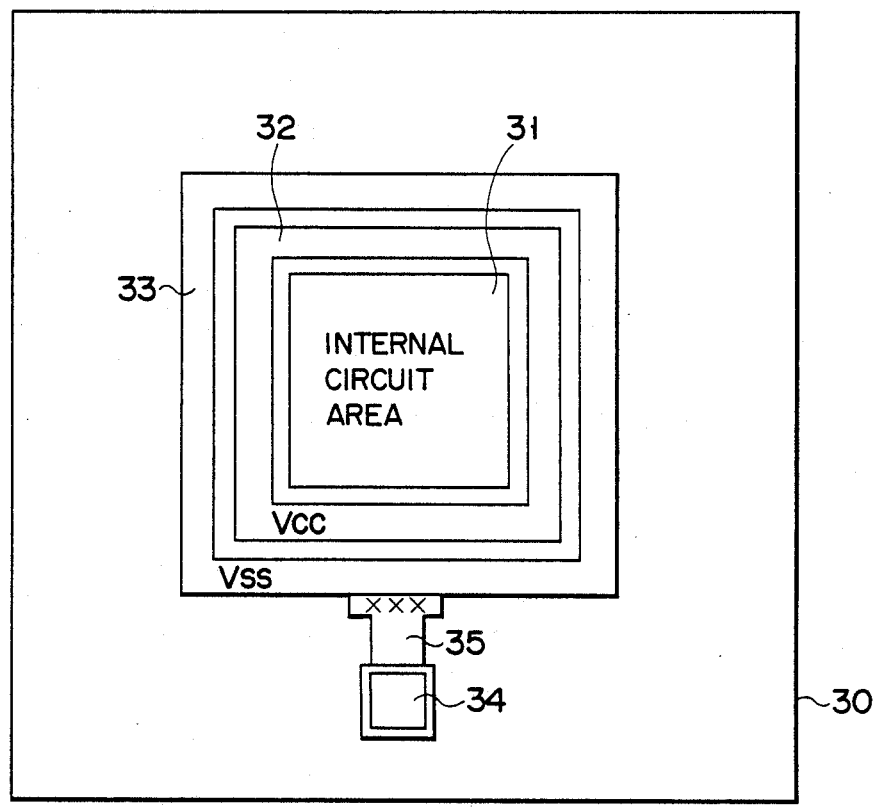
FIG. 3 is a plan view showing the entire construction of a device according to one embodiment of this invention.

A semiconductor integrated circuit device of multilayer interconnection structure according to this invention will now be described, with reference to the accompanying drawings. In FIG. 3, 30 denotes the main body of an LSI chip, and 31, an internal circuit area provided in main chip body 30. Power source interconnection layers 32 and 33 formed of metal are arranged in annular form around internal circuit area 31 or on the peripheral portion of the chip, and supply high potential power source voltage Vcc and low potential power source voltage Vss, respectively, to internal circuit area 31. In FIG. 3, 34 denotes a power source pad to which power source voltage Vcc to be supplied to power source interconnection layer 32 is supplied from outside the chip, power source pad 34 being connected to an internal pin of the LSI, via a bonding wire (not shown), as well as to power source interconnection layer 32, via lead-out interconnection layer 35. As will be described later, power source pad 34 and lead-out interconnection layer 35, for connecting pad 34 to power source interconnection layer 33, are each formed of a multi-layered conductive layer. Power source pad 34 has a plane pattern which is substantially square. The width of lead-out interconnection layer 35 is set to be less than the length of one side of power source pad 34. Various pads for the other power source supply and signal input and output are arranged on the peripheral portion of main chip body 30 although they are not shown. As will be described later, the entire chip is covered with a protection film (not shown), and openings are formed in those portions of the protection film at which the power source pads for connection with the bonding wires are provided.

FIG. 4 is a pattern plan view of an enlarged portion of the chip shown in FIG. 3. In FIG. 4, 36 denotes input/output cells formed on the peripheral portion of main chip body 30, 33 denotes a power source interconnection layer for supplying power source voltage Vss to input/output cells 36, and 37 denotes an opening of power source pad 34 in which no protection film is formed and a bonding wire is connected to the pad. In the case where the LSI chip is formed having a two-layer interconnection structure, power source interconnection layer 33 may be formed, for example, of a second metal interconnection layer.

Power source pad 34 is formed of first and second metal interconnection layers which are electrically connected to each other through VIA holes 38, and lead-out interconnection layer 35 is formed of the first metal layer formed integral with power source pad 34 and the second metal layer. The second metal layer constituting lead-out interconnection layer 35 is formed integral with power source interconnection layer 33, and the first metal layer is connected to the second metal layer through a plurality of VIA holes 38.

Numerals 40 denote pads for the other power source supply or signal supply, and are arranged on the peripheral portion of main chip body 30, together with power source pad 34, and numerals 41 denote openings formed in the protection film formed on pads 40.

FIG. 5 is a sectional view taken along line a—a' of FIG. 4 and shows the cross section of power source pad 34, lead-out interconnection layer 35 and power source interconnection layer 33. In FIG. 5, 50 denotes a semiconductor substrate, and first metal interconnection layer 52 formed of, for example, aluminum is disposed on insulation film 51, which is formed on substrate 50. Second metal interconnection layer 54 formed of, for example, aluminum is disposed on interlayer insulation film 53, which is formed on first metal interconnection layer 52. Second metal interconnection layer 54 is connected to first metal interconnection layer 52, through VIA hole 38 formed in that portion of interlayer insulation film 53 which lies in position corresponding to power source pad 34, and is additionally connected to first metal interconnection layer 52, through VIA hole 39 on that portion of lead-out interconnection layer 35 which lies in contact with power source interconnection layer 33.

In the case where lead-out interconnection layer 35 is formed by a two-layered metal interconnection layer, as in the device of the above embodiment, the effective width of the interconnection layer becomes twice that of a single-layer interconnection layer, as does the current capacity. Since the current capacity can therefore be increased with the plane width of the interconnection layer kept small, the area required for formation of the lead-out interconnection layer can also be made small. In this way, the power source current capacity can be increased without the need to increase the chip size.

Since, in the case of the multilayer interconnection process, an interconnection layer is formed at a higher level as viewed from the substrate surface, it becomes more difficult to make the surface of such an interconnection layer flat. Therefore, in order to prevent the breakage of wire at the stepped surface, the lower interconnection layer is generally formed thin. As a result, second metal interconnection layer 54 is formed to be thicker than first metal interconnection layer 52, resulting in the cross-sectional area of the former being large and the current capacity thereof increased. Thus, by forming second metal interconnection layer 54 as the upper layer on the conventional lead-out interconnection layer of single-layered structure, the current capacity can be substantially increased.

In the case where a current capacity the same as that of the conventional lead-out interconnection layer of single-layered structure is obtained by use of the two-layered metal interconnection layer, as in the device of the above embodiment, the plane width of the interconnection layer can be reduced in comparison with the case where the single-layered structure is used. As a result, distance 1 in FIG. 4, which is the restriction factor as concerns the bonding of a wire to the surface of power source pad 34, can be reduced to a minimum. Thus, use of the multilayer structure enables the chip size to be substantially reduced, particularly in the case of an LSI having a number of pads.

Figure 6:
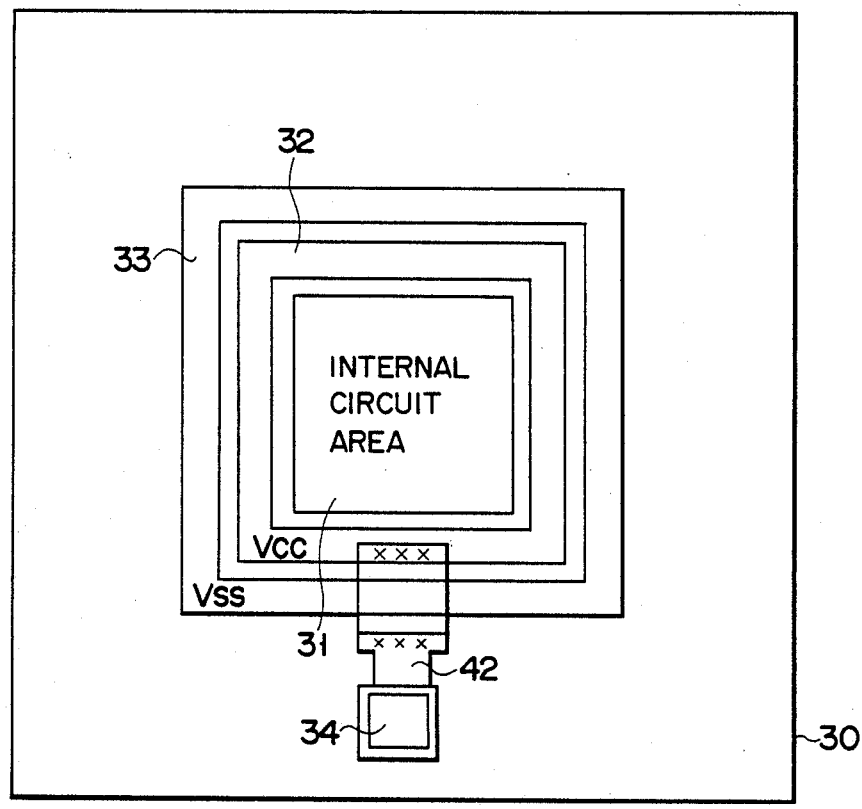
FIG. 6 is a plan view showing the entire construction of a device according to another embodiment of this invention.
Figure 7:
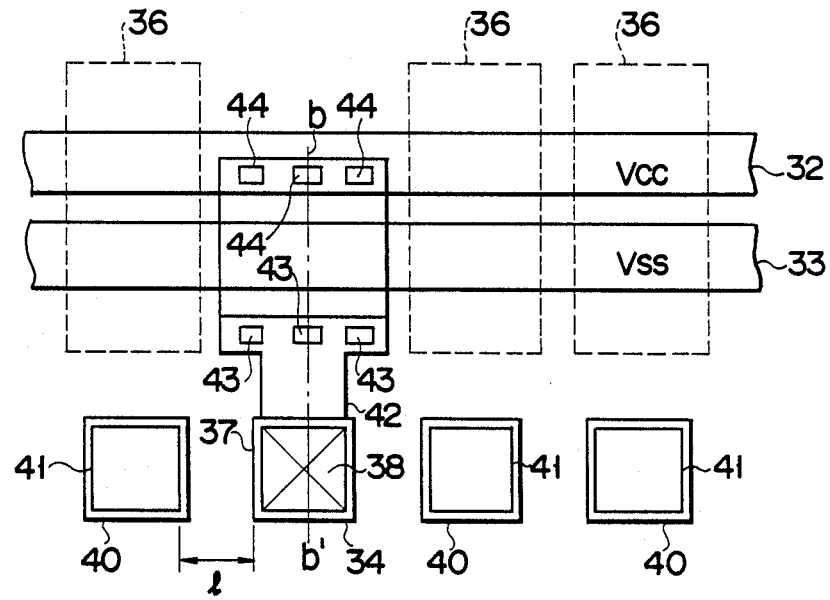
FIG. 7 is a pattern plan view showing part of the device of the embodiment shown in FIG. 6.
Figure 8:
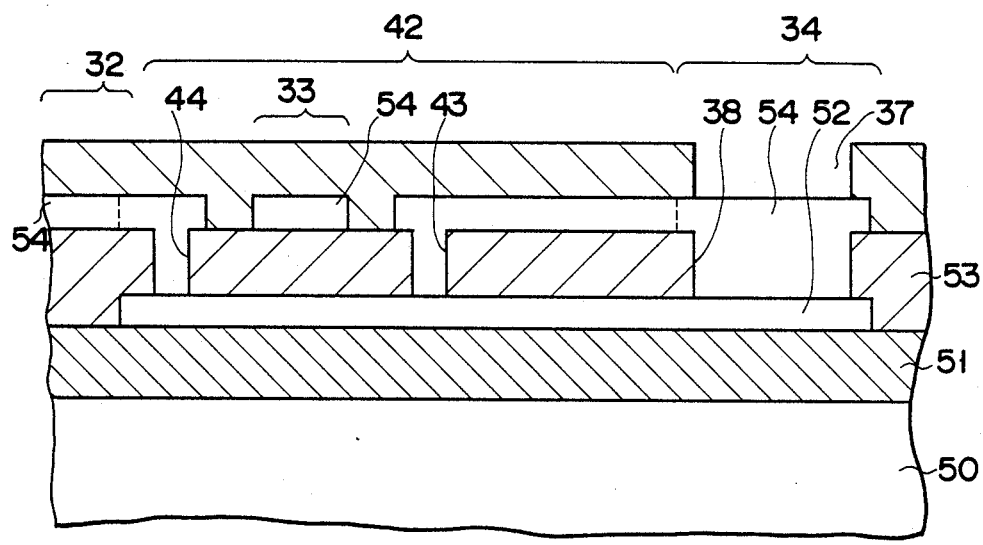
FIG. 8 is a sectional view taken along line a-a' of FIG. 7.

A semiconductor integrated circuit device according to a second embodiment of the invention will now be described, with reference to FIGS. 6 to 8. In FIGS. 6 to 8, portions corresponding to those in FIGS. 3 to 5 are denoted by the same reference numerals. In this embodiment, power source pad 34 is connected to one end of lead-out interconnection layer 42, which itself is arranged such that it crosses power source interconnection layer 33 and is connected, at its other end, to Vcc power source interconnection layer 32, which is disposed inside power source interconnection layer 33.

FIG. 7 is a pattern plan view of an enlarged portion of the chip shown in FIG. 6. In the case where the LSI is formed by the two-layered interconnection structure, power source interconnection layers 32 and 33 are each formed of a second metal interconnection layer of, for example, aluminum, and power source pad 34 is formed of the first and second metal interconnection layers which are electrically connected to each other through VIA hole 38. That portion of lead-out interconnection layer 42 which lies between power source pad 34 and power source interconnection layer 33 is formed of the first and second metal interconnection layers which are formed integrally with power source pad 34, and that portion of lead-out interconnection layer 42 which crosses power source interconnection layer 33 is formed of only the first metal interconnection layer the width of which is greater in this portion than in the remaining portion. In the case of lead-out interconnection layer 42, the first metal interconnection layer is connected to the second metal interconnection layer through VIA holes 43 in that portion which is formed of the first and second metal interconnection layers and lies in contact with power source interconnection layer 33. In addition, on that side of the lead-out interconnection layer 42 which is adjacent to the power source interconnection layer 32, first metal interconnection layer is connected through VIA hole 44 to the power source interconnection layer 32 which is formed of the second metal interconnection layer.

FIG. 8 is a sectional view taken along line b—b' of FIG. 7 and showing the cross section of power source pad 34, lead-out interconnection layer 42 and two power source interconnection layers 32 and 33. In power source pad 34, first metal interconnection layer 52 is connected to second metal interconnection layer 54 through VIA hole 38. In that portion of lead-out interconnection layer 42 which lies in contact with power source interconnection layer 33, first metal interconnection layer 52 is connected to second metal interconnection layer 54 through VIA holes 43, and that portion which crosses power source interconnection layer 33 is formed of only first metal interconnection layer 52. Further, in that portion of lead-out interconnection layer 42 which lies in contact with power source interconnection layer 32, first metal interconnection layer 52 is connected to power source interconnection layer 32 formed of second metal interconnection layer 54 through VIA holes 44.

In the device of the above embodiment, portion of lead-out interconnection layer 42 which is connected to power source pad 34 is formed of the second metal interconnection layer. Therefore, the width of lead-out interconnection layer 42 formed of that portion of first metal interconnection layer 52 which crosses power source interconnection layer 33 can be widened so that the corresponding portion of lead-out interconnection layer 42 may have the current capacity which can be attained by portion of lead-out interconnection layer 42 formed of the two-layered metal interconnection layer. The aforementioned width corresponds to width across the first metal interconnection layer at an area defined between VIA hole 43 and VIA hole 44. In this way, even when the lead-out interconnection layer crosses the other interconnection layer, a large current capacity can be attained.

This invention is not limited to the above embodiments, and can be variously modified. For example, in each of the above embodiments, this invention is explained with reference to the semiconductor integrated circuit device of two-layered interconnection structure. However, this invention can be applied to a semiconductor integrated circuit device of multilayer interconnection structure other than the two-layered interconnection structure. Further, in each of the embodiments, if there occurs no problem which causes fluctuation in voltage level by short-circuiting two portions kept at different voltage levels, for example, then the first and second metal interconnection layers can be replaced or different material can be used for forming the interconnection layers.

As described above, according to this invention, a semiconductor integrated circuit device can be provided in which the power source current capacity can be increased without increasing the chip size.

What is claimed is:
1. A semiconductor integrated circuit comprising:
a semiconductor substrate having a surface;
first and second power interconnection wiring members overlying the surface of the substrate, each wiring member disposed coplanar and spaced from the other;
power source pad means overlying the surface of the substrate and spaced peripherally from said second power interconnection layer; and
lead-out interconnection means for electrically connecting said power source pad means to said first power interconnection wiring member, said lead-out interconnection means having at least two non-coplanar interconnection layers, one of which is non-coplanar with the first and second power interconnection wiring members to provide a non-conductive crossing of the second power interconnec- tion wiring member, said one interconnection layer being electrically connected to the other non-coplanar interconnection layer through a via disposed offset from said power source pad means and connected to said second power interconnection wiring member through a via disposed offset therefrom to provide a width adjacent the power source pad, which width is smaller than the width of the crossing portion.

2. The semiconductor integrated device according to claim 1 wherein said first and second power interconnection wiring members include aluminum.

* * * * *